United States Patent [19]

Ford, Jr.

[11] Patent Number: 4,636,016
[45] Date of Patent: Jan. 13, 1987

[54] ACCESSORY CONNECTOR

[75] Inventor: Alexander P. Ford, Jr., Sebastian, Fla.

[73] Assignee: Motorola, Inc., Schaumburg, Ill.

[21] Appl. No.: 771,099

[22] Filed: Aug. 30, 1985

[51] Int. Cl.⁴ .............................................. H01R 9/09
[52] U.S. Cl. ................................ 339/17 F; 339/59 M;
339/176 MF
[58] Field of Search ............. 339/177 R, 177 E, 17 F,
339/176 MF, 17 E, 14 R, 255 R, 75 M, 59 M

[56] References Cited

U.S. PATENT DOCUMENTS

| | | | |
|---|---|---|---|
| 3,179,914 | 4/1965 | Uberbacher | 339/177 R |
| 3,201,722 | 8/1965 | May et al. | 339/177 R |
| 3,425,025 | 1/1969 | Williams | 339/75 M |
| 3,917,372 | 11/1975 | Selinko | 339/75 M |
| 3,946,390 | 3/1976 | Alexander et al. | 343/702 |
| 3,969,728 | 7/1976 | Hodsdon et al. | 343/702 |
| 4,024,542 | 5/1977 | Ikawa et al. | 343/702 |
| 4,339,756 | 7/1982 | Oyama et al. | 343/702 |
| 4,417,776 | 11/1983 | Motoyama | 339/255 R |
| 4,540,227 | 9/1985 | Faraci | 339/17 F |

OTHER PUBLICATIONS

AMP Incorporated Data Sheet No. 74-256, Revised 5-77, AMP Ampliflex Connector.

Primary Examiner—John McQuade
Attorney, Agent, or Firm—Daniel K. Nichols; Joseph T. Downey; Donald B. Southard

[57] ABSTRACT

An electrical connector having a plurality of contacts located within a housing. A multiple conductor electrical cable is received in another portion of the housing and the contacts and conductors are electrically connected. A flex circuit, which forms the contacts, is used for the electrical connection for the conductors. The flex circuit has one end wrapped around a cylindrical resilient member to form the contacts. The flex circuit is received by a support member in the housing for providing additional resilient support to the contacts.

11 Claims, 11 Drawing Figures

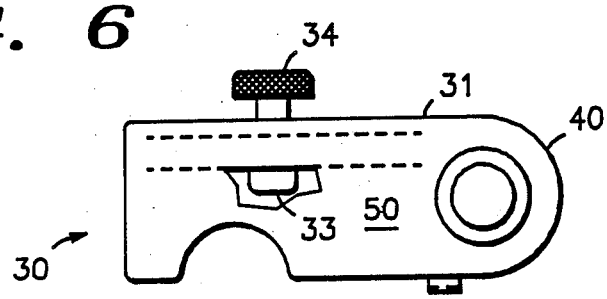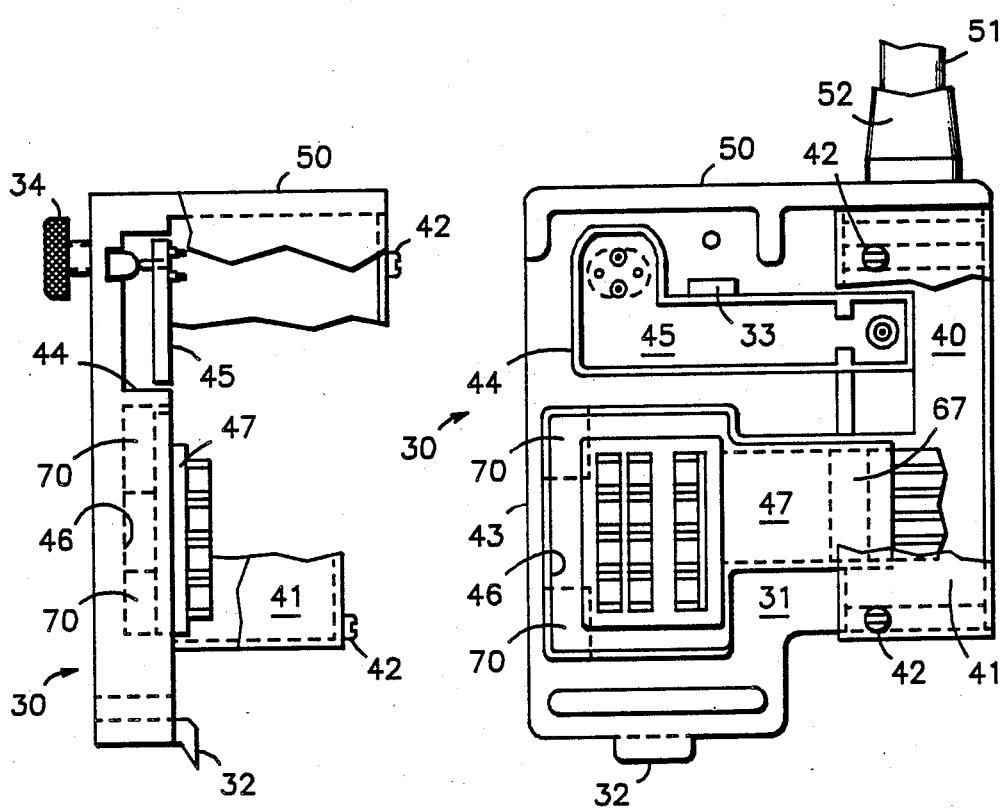

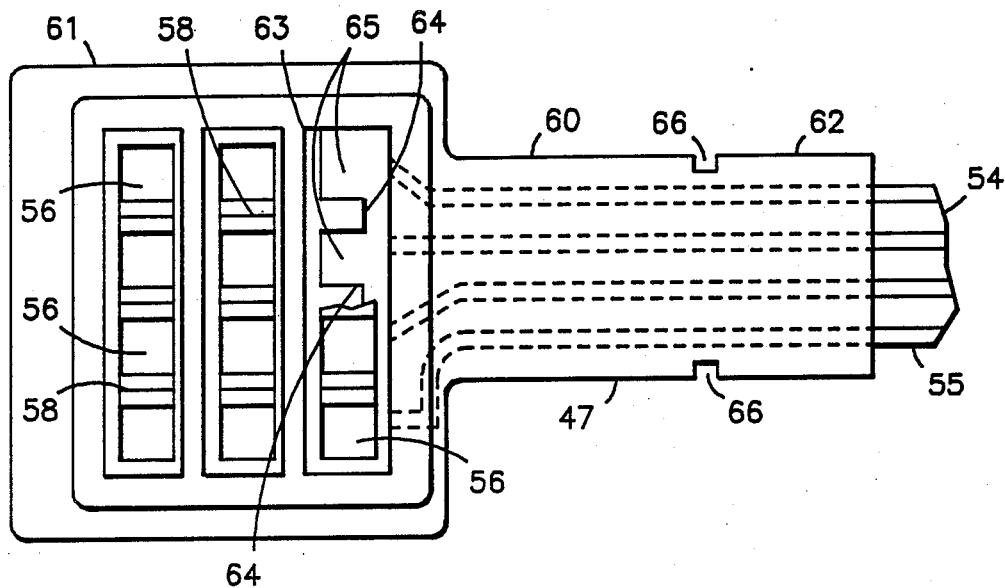
FIG. 7
FIG. 8
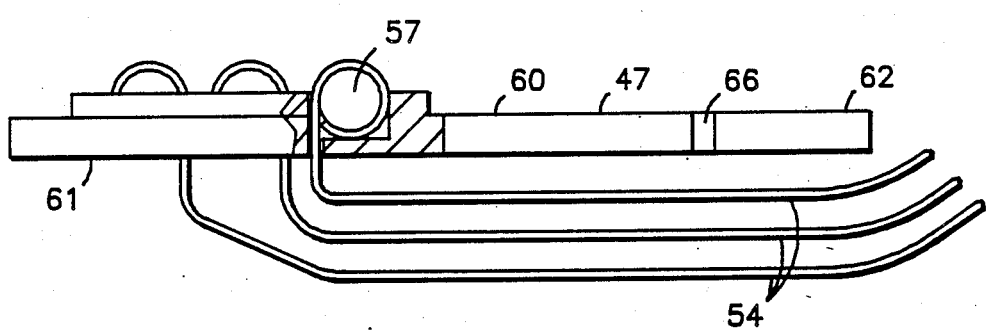

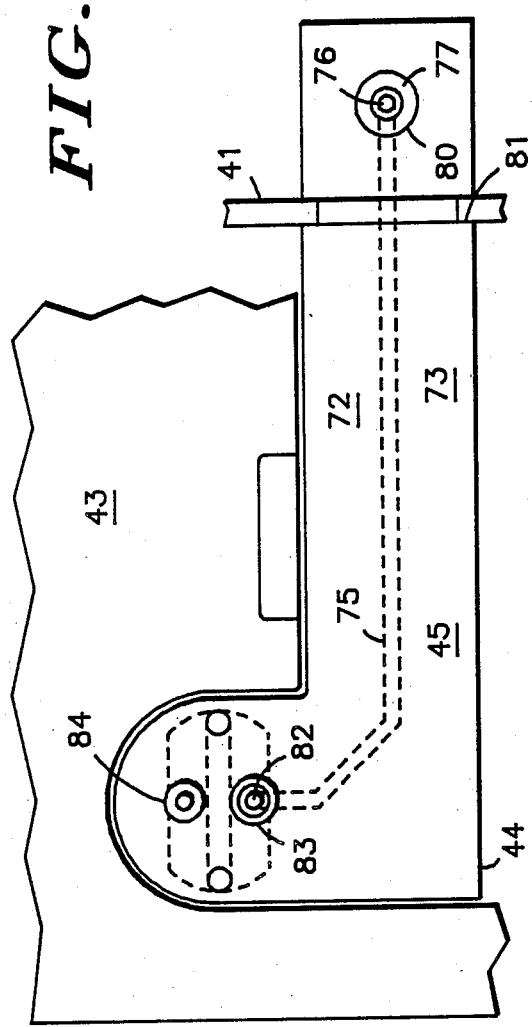
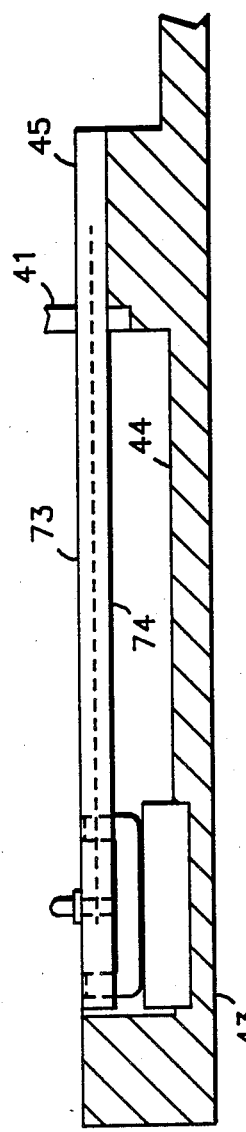
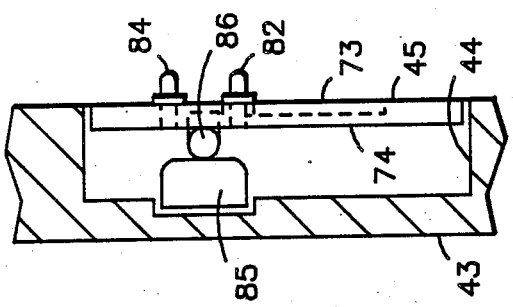
FIG. 9
FIG. 10
FIG. 11

ACCESSORY CONNECTOR

BACKGROUND OF THE INVENTION

This invention relates to electrical connectors in general and particularly to electrical connectors having a plurality of electrical contacts for engagement with flush contacts. There are numerous connector arrangements for providing multiple contact connections. Many of the prior art connectors utilize plug portions which are received within sockets. For example, such multi-pin connectors have been used on the sides of portable two-way radios for the connection of microphones and other accessory items.

It is desirable to use sealed flush contacts on such devices as radios as such a connector not only inhibits the intrusion of foreign substances, such as water and dust, but also provides a smooth clean exterior surface. It may also be desirable to place such contacts on the rear of a radio; this, however, presents an additional problem in that multiple contact connectors generally require a fairly bulky connector body in order to provide for the interconnection of multi-conductor cables with electrical contacts of the connector. It is not desirable to have such bulky connectors located on the rear of portable radios which are often worn against the human body.

SUMMARY OF THE INVENTION

This connector provides a means for connecting to multiple contacts while providing a relatively low profile and allows connection of a multi-conductor cable at a location spaced from the contact area.

In one aspect of the invention, a connector having a plurality of contacts includes a housing having first and second portions. A plurality of electrical contacts are located in the first housing portion, an electrical cable, which includes a number of conductors, has an end in the second housing portion and means electrically connect at least some of the contacts with at least some of the conductors in the housing second portion.

The housing first portion has a low profile relative to the housing second portion. In one aspect of the invention, the housing includes a lower flange, upper alignment tongue, and a fastening member.

In another aspect of the invention, the contacts and connecting means are formed from a multiconductor flex circuit. The flex circuit passes through a support member and is carried by the housing. The flex circuit includes an end that is wrapped around a cylindrical resiliently flexible member for providing the contacts. In still another aspect of the invention, the support member includes fingers for individually supporting the individual contacts.

In another aspect of the invention, a support member includes a contact carrying end portion and a longitudinal portion extending from the end portion. The housing is contoured to receive the support member and includes a cover on the housing second portion which retains the support member. In yet another aspect of the invention, the longitudinal portion of the support member includes a pair of opposed-side notches and the cover portion is received in the opposed-side notches for retaining the support member.

In still another aspect of the invention, the cable includes a coaxial cable and the plurality of contacts includes at least two RF contacts. The connecting means presents substantially the same impedance as the coaxial cable, and connects the RF contacts to the coaxial cable in the housing's second portion. Applicants copending application entitled "RF Connector", filed on even date herewith, provides further details on such RF connectors, the disclosure of which is hereby incorporated by reference.

BRIEF DESCRIPTION OF THE DRAWINGS

FIG. 4 is an elevational view of a connector, partially cut away.

FIG. 5 is a side elevational view of the connector of FIG. 4.

FIG. 6 is an top plan view of the connector of FIG. 4.

FIG. 7 is an enlarged fragmentary of the flex contact assembly of FIG. 4.

FIG. 8 is a side elevational view partially cut away of the flex contact assembly of FIG. 7.

FIG. 9 is an enlarged view of the RF connector of FIG. 4.

FIG. 10 is a side elevational view of the RF connector of FIG. 9.

FIG. 11 is a side elevational view of the RF connector of FIG. 9.

DESCRIPTION OF THE PREFERRED EMBODIMENT

Figure 1:
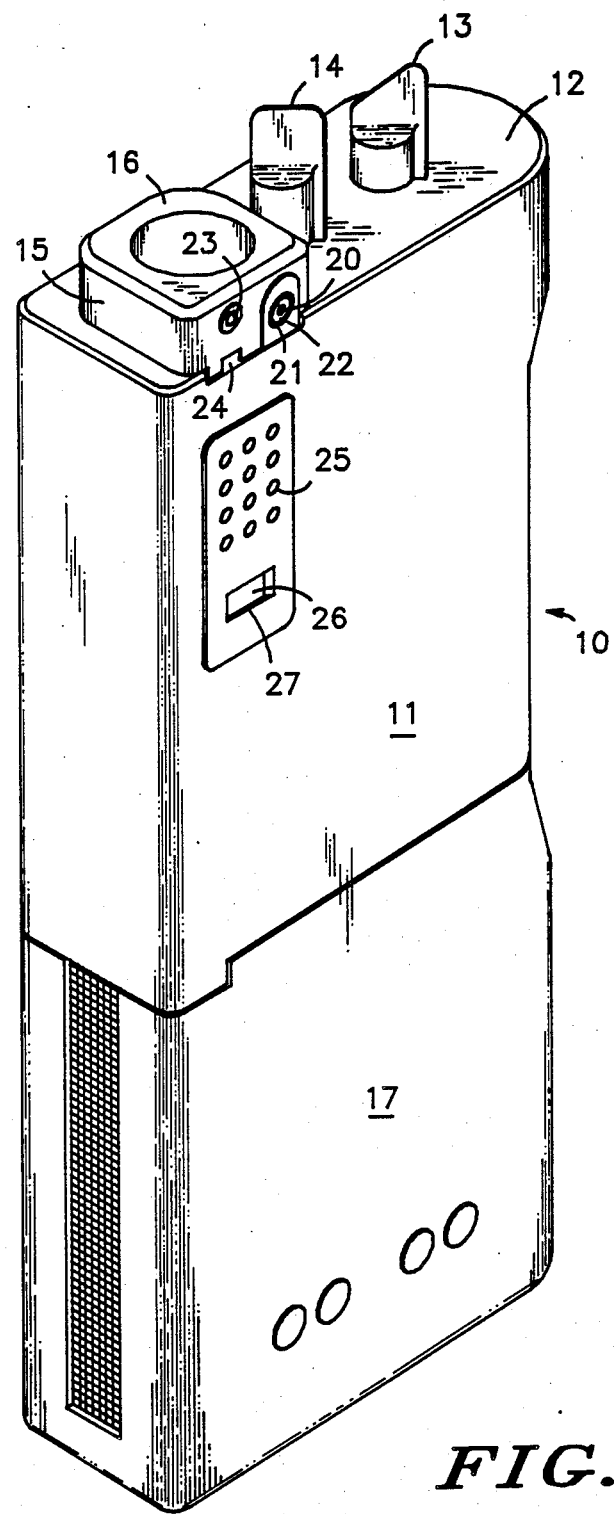
FIG. 1 is a perspective view of a portable radio having flush accessory and RF contacts.

Referring now by characters of reference to the drawings, and first to FIG. 1, it will be understood that a portable radio indicated generally as 10 can utilize the connector of this invention. The radio 10 includes a body 11 to which a battery portion 17 is detachably connected.

The body 11 includes a top 12 which carries volume and channel control knobs 13 and 14. The top 12 includes a pedestal portion 15 which can include a threaded mount 16 that is provided for receiving an antenna (not shown). The rear surface of the pedestal 15 includes flush coaxial RF contacts, including a center conductor 20 with a concentric connector portion 21 and insulator portion 22 between the center and concentric portions. The pedestal 15 also contains a threaded insert 23 provided for connector fastening purposes. The radio body 11 with pedestal 15 further defines a recess 24.

A plurality of electrical contacts 25 which, in this case, constitute 12 contacts laid out in grid fashion, are located on the back of the radio housing 11. It will be understood that the contacts 25 are substantially flush with the back of radio housing 11 and that the contacts 25 as well as contacts 20 and 22 lie substantially in the same plane as the back of the radio 10. Positioned below the contacts 25 in the radio body 11 is a tapered recess 26 having a lower lip 27. It will be appreciated that the contacts 25 are substantially positioned between the tapered recess 26 and threaded insert 23.

Figure 2:
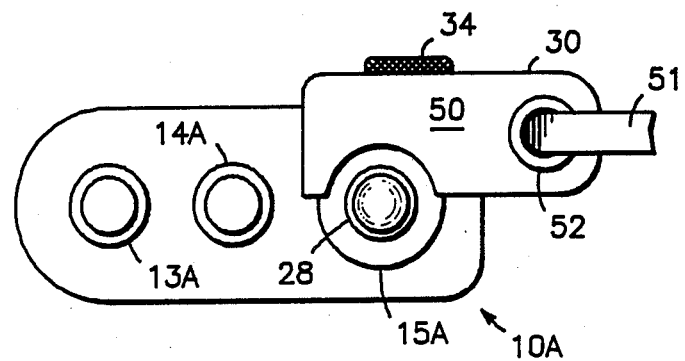
FIG. 2 is a top plan view of a radio with a connector attached.
Figure 3:
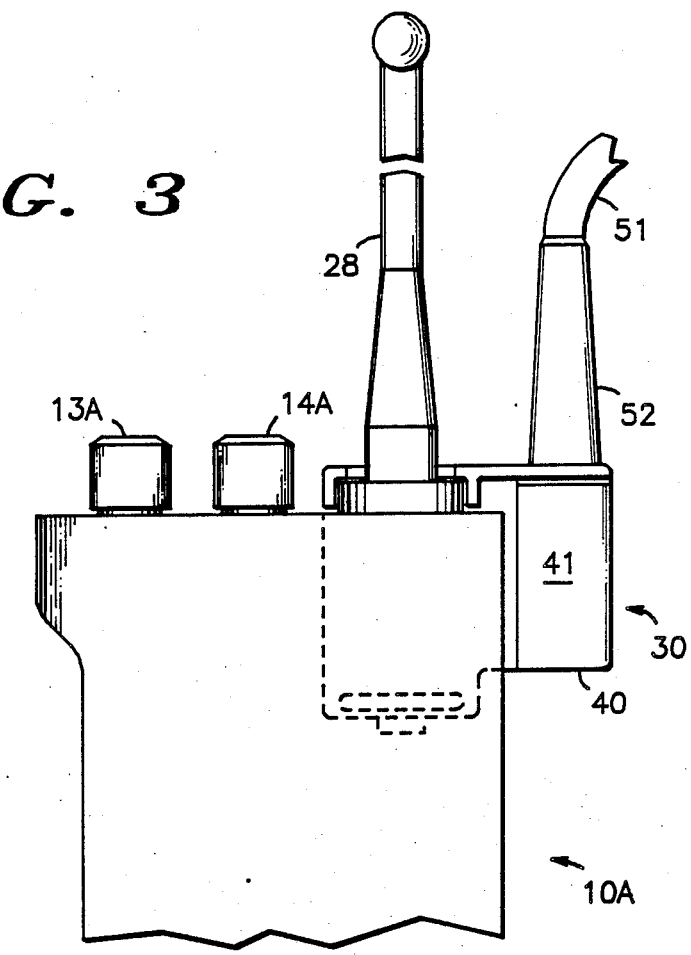
FIG. 3 is a fragmentary elevation view of the radio of FIG. 2.

In FIGS. 2 and 3 a slightly modified radio 10A, having different shaped knobs 13A and 14A, is shown with a connector 30 attached thereto. An antenna 28 is shown mounted at the pedistal 15A. The connector 30 will be discussed in further detail in reference to FIGS. 4-11.

Referring first to FIG. 4, it will be seen that the connector 30 includes a housing 31 having a tab 32, more clearly shown in FIG. 3, as well as an upper alignment tongue 33. A threaded thumb screw 34, best seen in FIG. 3 and 4, is provided. It will be understood that when attaching the connector 30 to the radio 10 or 10A, the tab 32 is first inserted in the recess 26 under the lip 27. The connector 30 is then pushed against the back of the radio 10 or 10A with the tongue 33 entering the slot 24 and the connector is fastened by threading the thumb screw 34 into the threaded insert 23 in order to mechanically mount the connector.

The connector housing 31 includes a body side portion 40 having a cover 41 which, when attached to the radio 10, are located to the side of the radio. The cover 41, is attached to the connector housing 30 as by screws 42.

The housing 31 includes a contact carrying portion 43 attached to the body side portion 40. The contact carrying portion 43 includes a first recess 44 which is contoured to receive an RF contact assembly 45 and a second recess 46 which is contoured to receive a multi-contact assembly 47. The housing 31 includes a top portion 50 which both covers the body side portion 40 and extends over the contact carrying portion 43. Entering the body side portion 40 as through the top portion 50 is a cable 51 which is supported by flex-relief rubber member 52. It will be appreciated that electrical connections between the cable 51 and the assemblies 45 and 47 can be made within the body side portion 40. Means for making such connections include soldering, the use of mating pins and sockets, and the like.

The multi-contact assembly 47 is shown in greater detail in FIGS. 7 and 8. The particular assembly 47, of the preferred embodiment, utilizes three flex circuits 54 with each of the flex circuits having a plurality of electrically conductive circuit traces 55, thereby providing a multi-conductor circuit. The flex circuits 54 are formed from a base of polyimide material having a copper coating. The copper is etched to provide the desired circuit traces 55. After etching, the copper traces are coated first with nickel and then with gold to provide the final surface. At one end of the flex circuit 54, the traces 55 diverge and are widened to provide the individual contacts 56. Shear cuts 58 are provided between the contacts 56 in order to allow individual contact movement. This portion of the flex circuit 54 is then wrapped around a cylindrical resiliently flexible material 57 such as silicon rubber and the flex circuit is adhered to itself as by pressure sensitive adhesive or other bonding method. The flex circuit 54 provides both the contacts 56 and connecting means connected to the contacts.

The assembly 47 includes a support member 60 having a contact carrying end portion 61 and a longitudinal portion 62 extending therefrom. The contact carrying portion 61 includes a plurality of slots 63 with one of the flex circuits 54 passing through a slot 63 with the contacts 56 disposed on one side of the contact carrying portion 61 and the flex circuit 54 extending on the other side of the contact carrying portion 61 and along the longitudinal portion 62. Contiguous with slot 63 is a plurality of notches 64 which define support fingers 65 in the contact carrying end portion 61. Each of the support fingers 65 is positioned under one of the contacts 56 in order to provide individual support to that contact.

The longitudinal portion 62 includes a pair of opposed side notches 66 which receive the cover portion 41, as illustrated in FIG. 4, for locking the assembly 47 in position. A resilient pad of flexible silicon rubber material 67 is positioned under the assembly 47 in the area of the notches 66 as illustrated in FIG. 4. Resilient silicon rubber pads 70 are positioned in the contoured area 46 to engage the contact carrying portion 61.

Referring now to FIGS. 9-11, the RF assembly 45 and associated housing is shown in greater detail. The assembly 45 is provided by strip line 72 having upper and lower ground plain surfaces 73 and 74. Positioned between the surfaces 73 and 74 and electrically insulated from them is a conductive strip 75. At one end of the assembly 45, the strip 75 terminates at a plated-through hole 76 that is surrounded on the surface 73 by conductive pad 77 and an insulated, etched ring 80. Conductive pad 77 and hole 76 provide a connection point as for a center conductor of a coaxial cable while a shield of a connective sealed cable can be connected directly to the ground plane surface 73. Spaced from this end of the assembly 45 are a pair of opposed side notches 81 which can receive the cover 41 for locking the assembly 45 in position.

The opposite end of the connective strip 75 is connected by a plated-through hole to a contact pin 82 which projects above ground plane surface 73 and is insulated therefrom by a etched area 83. A ground contact pin 84 is connected to the ground planes 73 and 74 in space relation from the pin 82 and also projects above the ground plane surface 73.

In order to bias the pins 82 and 84 into contact with a desired connector, a resilient silicon rubber pad 85 is positioned below the ground plane surface 74 in an area approximately between pins 82 and 84. In order to provide uniform force at pins 82 and 84, the pad engages a cylindrical wire 86 that runs transversely from the line between pins 82 and 84 and at equal distance from the two pins. This cylindrical wire 86 is connected to the strip line 72 as by soldering to opposed end plated-through holes in the strip line 72.

It is thought that the structural features and functional advantages of the accessory connector have become fully apparent from the foregoing description of parts, but for completeness of disclosure a brief description of the operation and function of the connector will be given.

It will be understood that the multi-contact assembly 47 can be utilized for various purposes in use of the portable radio 10. Such contacts can be used to carry the audio to drive a remote speaker, provide a microphone connection for a remote microphone, provide push-to-talk connection, as well as provide digital controls and display information, and provide test contacts for use in manufacturing assembly and testing of the radio.

The RF assembly 45 can be utilized for providing a remote antenna connection as for example on a microphone carried antenna of the type typical in public safety applications. It will be further appreciated that where an application does not require the use of the RF connectors, the RF assembly 45 can be deleted from the connector without impairing the operation of the multiple contact assembly 47. Likewise, the multiple contact assembly 47 can be removed from the connector 30 without affecting the operation and use of the RF contact assembly 45.

In use, when the connector 30 is attached to a devise such as radio 10, the contacts 56 are locked firmly into contact with the contacts 25 on the radio. The support member 60 can flex both in its longitudinal portion 62 as well as allowing individual flexing and biasing at the contacts 56 by the fingers 65. The contact carrying portion 61 is biased towards the contacts 25 by the resilient pads 70. The contacts 56 have their own resilience due to their flexible nature and the fact that they surround the resiliently flexible, cylindrical member 57.

This great variety of flexible-type members provides for good, solid electrical connection by the contacts 56 while allowing for some variation that may occur in positioning of the contacts 25 relative to their normal plane. For example, if the some of the contacts 25 are higher than others, this connector can compensate for this lack of uniformity.

With regard to the RF connector 45, the contact pins 82 and 84 mate with the contacts 20 and 21 and the RF connector on the radio 10. The strip line 45 will flex and bend causing the camming arrangement of cylindrical wire 86 to engage a resilient pad 85 for biasing the pins 82 and 84 firmly against the contacts 20 and 21 on the radio 10 thereby providing a reliable electrical connection to those contacts.

I claim as my invention:

1. An electrical connector comprising:
    a connector housing having a first portion and a second portion,
    at least one multi-conductor flex circuit extending from said connector second portion and forming a plurality of electrical contacts in said connector housing first poriton, the multi-conductor flex circuit being wrapped about a cylindrical flexible member to form said contacts,
    a support member carried by said housing and having a contact carrying portion including at least one slot and a longitudinal portion extending from said contact carrying portion.
    said multi-conductor flex circuit extending through said slot of said support member for supporting said flex circuit at said contacts.

2. The connector of claim 1, wherein: the support member includes notches contiguous with said slot, said notches defining support fingers of the support member with one of the support fingers being positioned under each of said contacts.

3. The connector of claim 1 wherein: said flex circuit includes shear cuts between said contacts to allow individual contact movement.

4. The connector of claim 1, wherein said housing first portion has a low profile relative to said housing second portion.

5. The connector of claim 4 wherein the housing first portion includes a lower tab, an upper alignement tongue and a fastening member.

6. The connector of claim 5, wherein said fastening member is a threaded thumb screw.

7. The connector of claim 4, wherein said connector includes an upper side portion said first and second portions.

8. The connector of claim 2, wherein said support member is formed of flexible material.

9. The connector of claim 2, wherein said support member longitudinal portion includes opposed side notches, and
    said housing second portion includes a cover portion received in the side notches for retaining the support member.

10. The connector of claim 2, wherein said housing includes at least one resilient pad for operatively supporting said support member and said contacts.

11. The connector of claim 10, wherein the resilient pad is positioned to engage said support member contact carrying portion.

* * * * *